(12) United States Patent
Lee et al.

(10) Patent No.: US 8,859,890 B2
(45) Date of Patent: Oct. 14, 2014

(54) SOLAR CELL AND METHOD OF MANUFACTURING THE SAME

(75) Inventors: Jung-Ho Lee, Seoul (KR); Sang-Won Jee, Euiwang-si (KR); Han-Don Um, Ansan-si (KR); Kwang-Tae Park, Ansan-si (KR); Jin-Young Jung, Ansan-si (KR)

(73) Assignee: Industry-University Cooperation Foundation Hanyang University Erica Campus, Ansan-Si (KR)

( * ) Notice: Subject to any disclaimer, the term of this patent is extended or adjusted under 35 U.S.C. 154(b) by 0 days.

(21) Appl. No.: 13/700,801

(22) PCT Filed: May 31, 2011

(86) PCT No.: PCT/KR2011/003984
§ 371 (c)(1),
(2), (4) Date: Nov. 29, 2012

(87) PCT Pub. No.: WO2011/152649
PCT Pub. Date: Dec. 8, 2011

(65) Prior Publication Data
US 2013/0068298 A1    Mar. 21, 2013

(30) Foreign Application Priority Data
May 31, 2010  (KR) .......................... 10-2010-0051094
May 31, 2011  (KR) .......................... 10-2011-0051965

(51) Int. Cl.
*H01L 31/0352*   (2006.01)
*B82Y 20/00*     (2011.01)
*H01L 31/18*     (2006.01)
*H01L 31/0232*   (2014.01)

(52) U.S. Cl.
CPC .... *H01L 31/0232* (2013.01); *H01L 31/035245* (2013.01); *B82Y 20/00* (2013.01); *H01L 31/186* (2013.01); *H01L 31/035254* (2013.01)
USPC ........................................................ 136/256

(58) Field of Classification Search
USPC .................................................. 136/243–265
See application file for complete search history.

(56) References Cited

U.S. PATENT DOCUMENTS

| | | | |
|---|---|---|---|
| 2008/0006319 A1 | 1/2008 | Bettge | |
| 2010/0012190 A1* | 1/2010 | Goto et al. | ..................... 136/261 |
| 2012/0255599 A1* | 10/2012 | Xu et al. | ....................... 136/255 |

FOREIGN PATENT DOCUMENTS

| | | |
|---|---|---|
| JP | 3-151672 | 6/1991 |
| JP | 4-296060 | 10/1992 |
| JP | 2006-261666 | 9/2006 |
| JP | 2008-53730 | 3/2008 |
| JP | 2008-182226 | 8/2008 |

(Continued)

*Primary Examiner* — Jonathan Johnson
*Assistant Examiner* — Christina Chern
(74) *Attorney, Agent, or Firm* — Lexyoume IP Meister, PLLC

(57) ABSTRACT

A solar cell and a method of manufacturing the same are provided. The solar cell includes: i) a first conductive layer; ii) a plurality of nano structures that are positioned on the first conductive layer and that are extended to cross a surface of the first conductive layer and that are separated from each other; iii) a resin layer that is positioned on the first conductive layer and that is filled at space between the plurality of nano structures; iv) at least one semiconductor layer that is positioned on the resin layer and that covers the plurality of nano structures; and v) a second conductive layer that covers the semiconductor layer and that has a light transmittance lower than that of the first conductive layer.

12 Claims, 22 Drawing Sheets

(56) References Cited

FOREIGN PATENT DOCUMENTS

| | | |
|---|---|---|
| JP | 2008-532321 | 8/2008 |
| JP | 2009-507397 | 2/2009 |
| JP | 2009-537994 | 10/2009 |
| JP | 2010-28092 | 2/2010 |
| JP | 2010-512013 | 4/2010 |
| KR | 10-0988206 | 6/2010 |
| KR | 10-2010-0138703 | 12/2010 |
| KR | 10-1033028 | 12/2010 |
| KR | 10-1036453 | 1/2011 |
| WO | 2007/134322 | 11/2007 |
| WO | 2009-100458 | 8/2009 |

* cited by examiner

SOLAR CELL AND METHOD OF MANUFACTURING THE SAME

CROSS-REFERENCE TO RELATED APPLICATION

This application claims priority to and the benefit of Korean Patent Application No. 10-2010-0051094 and 10-2011-0051965 filed in the Korean Intellectual Property Office on May 31, 2010 and May 31, 2011, the entire contents of which are incorporated herein by reference.

BACKGROUND OF THE INVENTION (a) Field of the Invention

The present invention relates to a solar cell and a method of manufacturing the same. More particularly, the present invention relates to a solar cell and a method of manufacturing the same that have an improved light absorption efficiency and photoelectric conversion efficiency.

(b) Description of the Related Art

Nowadays, due to resource exhaustion and increase of a resource price, research and development of clean energy has been actively performed. Clean energy includes, for example, sun energy, wind energy, and tidal energy. Particularly, in order to efficiently use sun energy, research and development of a solar cell has been continuously performed.

A solar cell is an apparatus that converts light energy of sun to electrical energy. When sun light is applied to the solar cell, electrons and holes are generated at the inside of the solar cell. The generated electrons and holes are moved to a P electrode and an N electrode that are included in the solar cell, a potential difference occurs between the P electrode and the N electrode and thus a current flows.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a solar cell having advantages of being capable of producing using a simple process and excellent photoelectric conversion efficiency and light absorption efficiency. The present invention has been made in an effort to further provide a method of manufacturing the solar cell.

An exemplary embodiment of the present invention provides a solar cell including: i) a first conductive layer; ii) a plurality of nano structures that are positioned on the first conductive layer and that are extended to cross a surface of the first conductive layer and that are separated from each other; iii) a resin layer that is positioned on the first conductive layer and that is filled at space between the plurality of nano structures; iv) at least one semiconductor layer that is positioned on the resin layer and that covers the plurality of nano structures; and v) a second conductive layer that covers the semiconductor layer and that has a light transmittance lower than that of the first conductive layer.

The solar cell may further include a dielectric layer that is positioned on a surface of the plurality of nano structures and that contacts with the resin layer. The second conductive layer may have a thickness of 20 μm to 100 μm. The solar cell may further include at least one electron transfer body that is positioned on the first conductive layer and that contacts with a lower end portion of the plurality of nano structures. The second conductive layer and the electron transfer body may include the same metal. The metal may be at least one element that is selected from a group consisting of aluminum (Al), silver (Ag), nickel (Ni), gold (Au), and platinum (Pt). The at least one electron transfer body may include a plurality of electron transfer bodies, and the plurality of electron transfer bodies may be separated from each other. The electron transfer body may have an average diameter larger than that of the plurality of nano structures.

The electron transfer body may cover the first conductive layer, and the electron transfer body may include a p+ type semiconductor material or an n+ type semiconductor material. The at least one semiconductor layer may include a plurality of semiconductor layers, and a semiconductor layer contacting with the electron transfer body of the plurality of semiconductor layers may include an intrinsic material.

The at least one semiconductor layer may include a plurality of semiconductor layers, and at least one semiconductor layer of the plurality of semiconductor layers may include i) a plurality of first semiconductor portions that are positioned on the plurality of first nano structures; and ii) a second semiconductor portion that is connected to the first semiconductor portion to be integrally formed with the first semiconductor portion and that is positioned on the resin layer. A width between upper end portions of the plurality of first semiconductor portions may be 100 nm to 2 μm.

The solar cell may further include a cover layer that covers the second conductive layer and that contacts with a side surface of the resin layer. The solar cell may further include a contact electrode that is positioned within the cover layer and that electrically connects the second conductive layer to the outside by contacting with the second conductive layer.

The plurality of nano structures may include a semiconductor material. The first conductive layer may have a thickness of 30 nm to 300 nm. The dielectric layer may include at least one material that is selected from a group consisting of aluminum oxide ($Al_2O_3$), silicon nitride ($SiN_x$), silicon carbide (SiC), and silicon dioxide ($SiO_x$).

Another embodiment of the present invention provides a solar cell including: i) a first conductive layer; ii) a plurality of nano structures that are positioned on the first conductive layer and that are extended to cross a surface of the first conductive layer and that are separated from each other; iii) a plurality of semiconductor layers that cover the plurality of nano structures; and iv) a second conductive layer that covers the plurality of semiconductor layers and that has a light transmittance higher than that of the first conductive layer. At least one semiconductor layer of the plurality of semiconductor layers includes i) a plurality of first semiconductor portions that are positioned on the plurality of nano structures; and ii) a second semiconductor portion that is connected to the plurality of first semiconductor portions to be integrally formed with the plurality of first semiconductor portions and that is positioned on the first conductive layer.

The second conductive layer may have a light transmittance lower by 90% to 99% than that of the first conductive layer in a visible ray area. A diameter of the plurality of nano structures may reduce as being away from a surface of the first conductive layer. The plurality of nano structures may include i) a first nano structure that is applied to trap incident light; and ii) a second nano structure that is positioned together with the first nano structure and that is applied to convert incident light to power.

The solar cell may further include another semiconductor layer that is positioned between the first conductive layer and the plurality of nano structures. The other semiconductor layer may include an n+ type semiconductor material or a p+ type semiconductor material. A lower surface of the plurality of nano structures contacting with the other semiconductor layer may be unevenly formed. The solar cell may further include an anti-reflection layer that is positioned under the first conductive layer.

Yet another embodiment of the present invention provides a method of manufacturing of a solar cell, the method including: i) providing a substrate and a plurality of nano structures that are positioned on the substrate and that are separated from each other; ii) providing a resin layer that are positioned on the substrate and that fills space between the plurality of nano structures; iii) partially exposing the plurality of nano structures by etching an upper portion of the resin layer; iv) providing at least one semiconductor layer on the exposed plurality of nano structures; v) providing a conductive layer on the semiconductor layer; vi) providing a cover layer that covers the conductive layer; vii) separating the substrate; and viii) providing another conductive layer having a light transmittance lower than that of the conductive layer under the resin layer.

The method may further include providing a dielectric layer that contacts with the resin layer and that is positioned on a surface of the plurality of nano structures. The partially exposing of the plurality of nano structures may include etching a dielectric layer contacting with an upper portion of the resin layer among the dielectric layer. The providing of a conductive layer may include performing electroless plating of the conductive layer on the semiconductor layer. The method may further include: after the separating of the substrate, i) forming a hole that exposes a lower end portion of the plurality of nano structures to the outside in the resin layer by etching the resin layer; and ii) providing an electron transfer body to the hole. The providing of an electron transfer body may include providing the electron transfer body by electroless plating.

The providing of a substrate and a plurality of nano structures may include decreasing a diameter of the plurality of nano structures as being away from a surface of the substrate. The substrate and the plurality of nano structures may be integrally provided by electroless etching. The plurality of nano structures may be additionally etched.

At providing of a cover layer, the cover layer may include a resin. At the providing of at least one semiconductor layer, the at least one semiconductor layer may include a plurality of semiconductor layers, and the plurality of semiconductor layers may be formed by ion doping. The method may further include providing, after the providing of a conductive layer, a contact electrode that electrically connects the conductive layer to the outside by contacting with the conductive layer on the conductive layer.

Yet another embodiment of the present invention provides a method of manufacturing a solar cell, the method including: i) providing a substrate and a plurality of nano structures that are positioned on the substrate and that are separated from each other; ii) providing at least one semiconductor layer on the plurality of nano structures; iii) providing a conductive layer on the semiconductor layer by electroless plating; providing a cover layer that covers the conductive layer; iv) separating the substrate; and v) providing another conductive layer having a light transmittance lower than that of the conductive layer under the plurality of nano structures.

The method may further include providing another semiconductor layer between the plurality of nano structures and the other conductive layer. At the providing of another semiconductor layer, the other semiconductor layer may include a p+ type semiconductor material or an n+ type semiconductor material. The method may further include providing an anti-reflection layer under the other conductive layer.

A solar cell having an excellent light absorption efficiency and photoelectric conversion efficiency can be produced using a nano structure, a dielectric layer, and a resin layer. Further, because a solar cell is produced by separating the substrate, the substrate can be recycled. A solar cell can be simply produced using an electroless etching method.

DETAILED DESCRIPTION OF THE EMBODIMENTS

Figure 1:
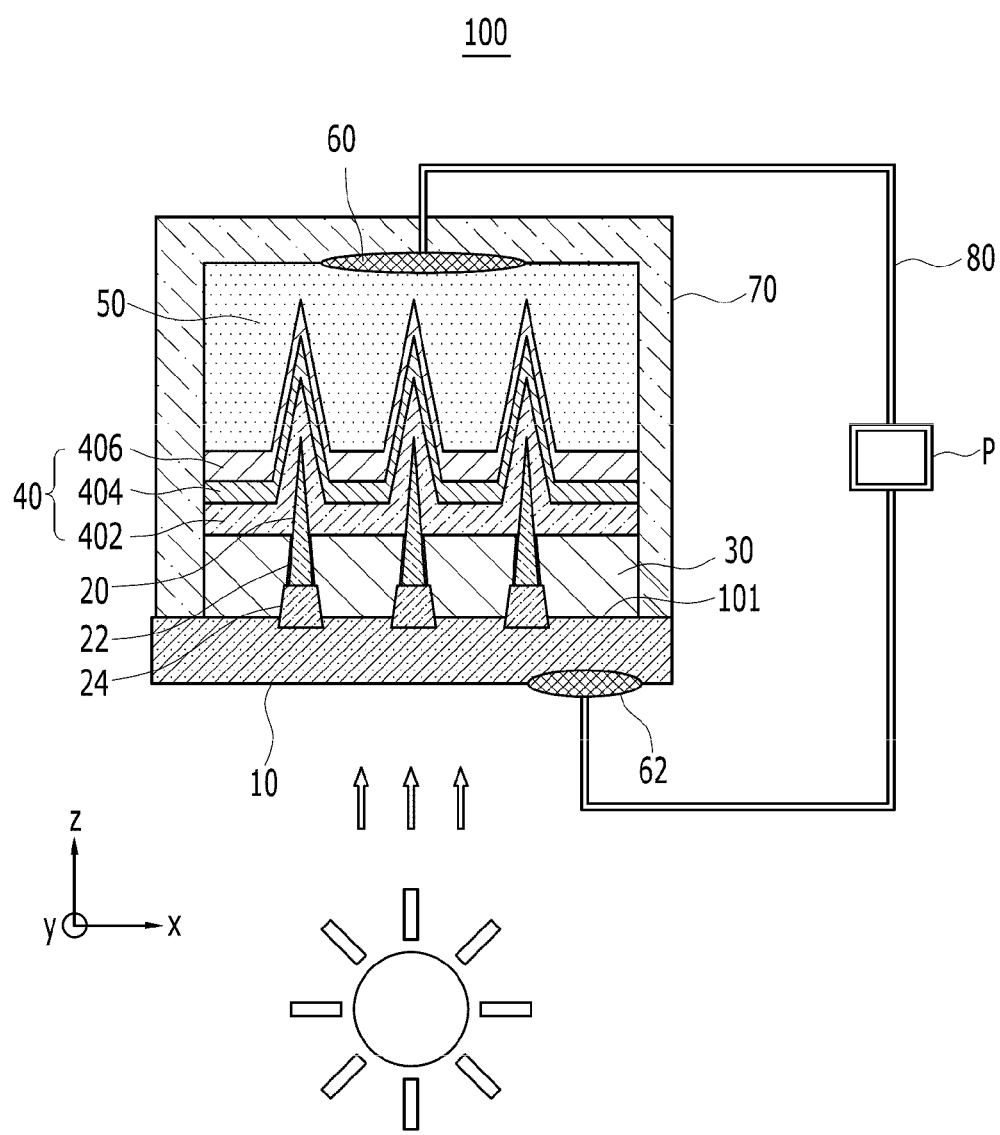
FIG. 1 is a schematic cross-sectional view illustrating a solar cell according to a first exemplary embodiment of the present invention.

When it is said that any part is positioned "on" another part, it means the part is directly on the other part or above the other part with at least one intermediate part. In contrast, if any part is said to be positioned "directly on" another part, it means that there is no intermediate part between the two parts.

Technical terms used here are to only describe a specific exemplary embodiment and are not intended to limit the present invention. Singular forms used here include a plurality of forms unless phrases explicitly represent an opposite meaning. A meaning of "comprising" used in a specification embodies a specific characteristic, area, integer, step, operation, element and/or component and does not exclude presence or addition of another specific characteristic, area, integer, step, operation, element, component and/or group.

Terms representing relative space of "low" and "upper" may be used for more easily describing a relationship to another portion of a portion shown in the drawings. Such terms are intended to include other meanings or operations of a using apparatus together with a meaning that is intended in the drawings. For example, when an apparatus is inverted in the drawings, any portion described as disposed at a "low" portion of other portions is described as being disposed at an "upper" portion of other portions. Therefore, an illustrative term of "low" includes entire upper and lower directions. An apparatus may rotate by 90° or another angle, and a term representing relative space is accordingly analyzed.

Although not differently defined, entire terms including a technical term and a scientific term used here have the same meaning as a meaning that may be generally understood by a person of common skill in the art. It is additionally analyzed that terms defined in a generally used dictionary have a meaning corresponding to a related technology document and presently disclosed contents and are not analyzed as an ideal or very official meaning unless stated otherwise.

A term of "nano" using hereinafter means that a size of an object is a nano unit. However, a nano unit may be analyzed to include a micro unit.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

FIG. 1 is a schematic cross-sectional view illustrating a section structure of a solar cell 100 according to a first exemplary embodiment of the present invention. The section structure of the solar cell 100 of FIG. 1 only illustrates the present invention, and the present invention is not limited thereto. Therefore, the section structure of the solar cell 100 may be changed to other forms.

As shown in FIG. 1, the solar cell 100 includes a first conductive layer 10, a plurality of nano structures 20, a dielectric layer 22, a resin layer 30, a plurality of semiconductor layers 40, and a second conductive layer 50. In addition, the solar cell 100 may further include an electron transfer body 24, a cover layer 70, contact electrodes 60 and 62, and a drawn-out wiring 80. Power that is generated by the light in the solar cell 100 is used for driving a passive element P. Meanwhile, the solar cell 100 may further include other elements in addition to elements that are shown in FIG. 1.

Because the first conductive layer 10 and the second conductive layer 50 are connected to the contact electrodes 60 and 62 and the drawn-out wiring 80, respectively, power that is generated in the solar cell 100 drives the passive element P. As indicated by an arrow of FIG. 1, light is applied in a +z-axis direction through the first conductive layer 10. Therefore, the first conductive layer 10 is a transparent electrode and is transparently formed to transmit light using a material such as indium tin oxide (ITO) or zinc oxide that is doped with Al/Ga.

The second conductive layer 50 reflects again light to the semiconductor layer 40, thereby maximizing generation of an electromotive force. For this purpose, the second conductive layer 50 is formed in an opaque layer to well reflect and is made of a metal material. For example, the second conductive layer 50 may include aluminum (Al), silver (Ag), nickel (Ni), gold (Au), or platinum (Pt). When the semiconductor layer 40 is made of an n+ type semiconductor material, aluminum (Al) or silver (Ag) that forms an ohmic contact is used as a material of the second conductive layer 50. Further, when the semiconductor layer 40 is made of a p+ type semiconductor material, nickel (Ni), gold (Au), or platinum (Pt) is used as a material of the second conductive layer 50. The second conductive layer 50 has a light transmittance lower than that of the first conductive layer 10. Therefore, because light does not pass through the second conductive layer 50 and is totally reflected, light is converted to power by the plurality of nano structures 20 and the semiconductor layer 40.

More specifically, in a visible ray area, a light transmittance of the second conductive layer 50 is lower by 90% to 99% than that of the first conductive layer 10. By adjusting a light transmittance difference between the first conductive layer 10 and the second conductive layer 50 to the above-described range, light loss in the solar cell 100 may be minimized. The second conductive layer 50 does not transmit light. Here, the second conductive layer 50 may be formed using an electroless deposition method or an electrolysis deposition method. The second conductive layer 50 functions as a back reflector that well absorbs near infrared rays having a wavelength range of 1100 nm to 1600 nm. Therefore, the nano structure 20 can absorb light to the maximum due to the second conductive layer 50. Consequently, while maximizing a quantity of light that passes through the first conductive layer 10 within the above-described light transmittance range, reflectivity of light by the second conductive layer 50 can be maximized.

As shown in FIG. 1, the plurality of nano structures 20 are separately positioned on the first conductive layer 10. The plurality of nano structures 20 are extended in a direction crossing a surface 101 of a substrate 10, i.e., in +z-axis direction. The nano structure 20 has a cone shape. Although not shown in FIG. 1, the nano structure 20 may have a cylindrical shape. The nano structure 20 that is formed as monocrystal is made of an n-type material or a p-type material and absorbs light.

Because the semiconductor layer 40 is conformally formed with the nano structure 20, the semiconductor layer 40 absorbs well light by a short carrier collection. Further, the plurality of nano structures 20 do not absorb light as an n+ type or a p+ type and may be used as an electrical passage of electrons or holes that are absorbed from the stacked semiconductor layer 40. In this case, the plurality of nano structures 20 function as an n+ selective emitter and quickly transfer electrons or holes that are absorbed by a single carrier collection by the semiconductor layer 40 to an emitter, thereby preventing a recombination thereof. Therefore, because a large amount of electrons and holes are generated, generation of an electromotive force may be maximized using the generated large amount of electrons and holes. Further, the nano structures 20 and the semiconductor layer 40 maximizes light absorption efficiency by trapping light through a stacked structure thereof. Because the plurality of nano structures 20 have a cone shape, a diameter of the plurality of nano structures 20 decreases as being away from a surface of the first conductive layer 10.

In general, solar cells to which light is applied much exist at an upper end portion of a cone of shapes of a nano structure. However, in an exemplary embodiment of the present invention, by producing the solar cell 100 with an opposite method, an light absorption efficiency by the plurality of nano structures 20 can be maximized. That is, incident light is well absorbed to the inside of the solar cell 300 by multiple reflection and scattering effects. Further, electrons or holes that are generated in the nano structures 233 perform carrier collection through the second conductive layer 75 by tunneling an oxide film 33. As described above, some nano structures of the nano structures 20 in which the semiconductor layer 40 is formed confine light and are used as paths of electrons and holes, and the remaining nano structures may be used for photoelectric conversion. For example, a half of the nano structures 20 of in which the semiconductor layer 40 is formed may trap incident light and be used as pass of electrons and holes, and the remaining half may be used for converting light to power. Further, by using the resin layer 30, the solar cell 100 having a structure that is shown in FIG. 1 can be produced.

The resin layer 30 is positioned on the first conductive layer 10. The resin layer 30 is filled at space between the plurality of nano structures 20 to contact with the dielectric layer 22 that is positioned at a surface of the plurality of nano structures 20. Here, the dielectric layer 22 is formed at a surface of the plurality of nano structures 20 and passivates the plurality of nano structures 20. For this purpose, the dielectric layer 22 is made of a material including aluminum oxide ($Al_2O_3$), silicon nitride $SiN_x$, silicon carbide (SiC), or silicon dioxide ($SiO_2$) having characteristics that prevent reflection or having passivation characteristics. Particularly, aluminum oxide ($Al_2O_3$) is excellent in a passivation ability for a p-type semiconductor material, and silicon nitride ($SiN_x$) or silicon dioxide ($SiO_2$) is excellent in a passivation ability for a p-type semiconductor material. The dielectric layer 22 prevents charges generated at a surface of the nano structures 20 from recombining, thereby well transferring holes or charged that are generated in the nano structures 20 to the outside without damage. As a result, by enhancing transfer efficiency of electrons or holes, an electromotive force of the solar cell 100 can be improved. Meanwhile, at a surface in which the plurality of nano structures 20 contact with the first semiconductor layer 402, the dielectric layer 22 is not formed for a semiconductor junction. In some case, a production of the dielectric layer 22 may be omitted.

As shown in FIG. 1, the electron transfer body 24 is positioned on the first conductive layer 10 and contacts with a lower end portion of the plurality of nano structures 20. Here, the electron transfer body 24 is made of metal. Therefore, electrons that are generated by an interaction with the semiconductor layer 40 and the nano structures 20 efficiently flow toward the first conductive layer 10 through the electron transfer body 24. For this purpose, the electron transfer body 24 may be made of metal such as nickel. That is, the electron transfer body 24 and the second conductive layer 50 may include the same metal.

Further, an average value of an average diameter of the electron transfer body 24, i.e., a diameter of a section of the electron transfer body 24 that is taken in an xy-plane direction is larger than that of an average diameter of the plurality of nano structures 20, i.e., a diameter of a section of the nano structure 20 that is taken in an xy-plane direction. Therefore, electrons that are generated at the plurality of nano structures 20 efficiently escape toward the first conductive layer 10 through the electron transfer body 24.

The semiconductor layer 40 includes a first semiconductor layer 402, a second semiconductor layer 404, and a third semiconductor layer 406. A plurality of semiconductor layers 402, 404, and 406 are shown in FIG. 1, but a semiconductor layer may be formed in one layer or two layers. Further, the number of semiconductor layers may be four or more.

Here, the semiconductor layer 40 may be formed at one time with a method of changing only a doping source while injecting $SiH_4$ gas into a chamber by plasma enhanced chemical vapor deposition (PECVD). Because the plurality of nano structures 20 include a semiconductor material, the plurality of nano structures 20 form a semiconductor junction with the semiconductor layer 40. For example, the nano structure 20 may be made of an n+ type semiconductor material, the first semiconductor layer 402 may be made of an n-type material, the second semiconductor layer 404 may be made of an intrinsic material, and the third semiconductor layer 406 may be made of a p-type semiconductor material. Here, the used plurality of nano structures 20 and semiconductor layer 40 may be formed by ion doping silicon. In this case, because the plurality of nano structures 20, the first semiconductor layer 402, the second semiconductor layer 404, and the third semiconductor layer 406 are conformally formed, by lowering an energy band gap, an electromotive force can be efficiently improved. Amorphous silicon is used as an intrinsic material. The plurality of nano structures 20 that are made of an n+ type semiconductor material are used as a conduction passage of electrons and a selective emitter. Because the second conductive layer 50 is positioned on the third semiconductor layer 406, the second conductive layer 50 totally reflects light that transmits the third semiconductor layer 406 and thus an electromotive force that is generated by the nano structures 20 and the semiconductor layer 40 can be maximized.

Although not shown in FIG. 1, the nano structure 20 is made of an n-type semiconductor material or an n+ type semiconductor material, a semiconductor layer that covers the nano structure 20 is formed in two layers, a layer that contacts with the nano structure 20 is made of an intrinsic material, a layer that covers the above layer is made of a p-type semiconductor material. Further, the nano structure 20 may be made of an n-type semiconductor material or an n+ type semiconductor material, and a semiconductor layer that covers the nano structure 20 may be made of a p-type semiconductor material. The above-described semiconductor materials may be produced using amorphous silicon.

The cover layer 70 covers the second conductive layer 50 and contacts with a side surface of the resin layer 30. The cover layer 70 is made of polydimethylsiloxane (PDMS) or polyimide. Because the cover layer 70 is made of such a material, the solar cell 100 has flexible characteristics. Therefore, by grasping the cover layer 70 by a hand, the solar cell 100 may be bent.

As shown in FIG. 1, the contact electrodes 60 and 62 include a first contact electrode 60 and a second contact electrode 62. The first contact electrode 60 is positioned at the inside of the cover layer 70. The first contact electrode 60 contacts with the second conductive layer 50 and electrically connects the second conductive layer 50 to the outside. That is, the first contact electrode 60 connects the drawn-out wiring 80 and the second conductive layer 50. Hereinafter, a method of manufacturing the solar cell 100 of FIG. 1 will be described in detail with reference to FIGS. 2 to 12.

Figure 2:
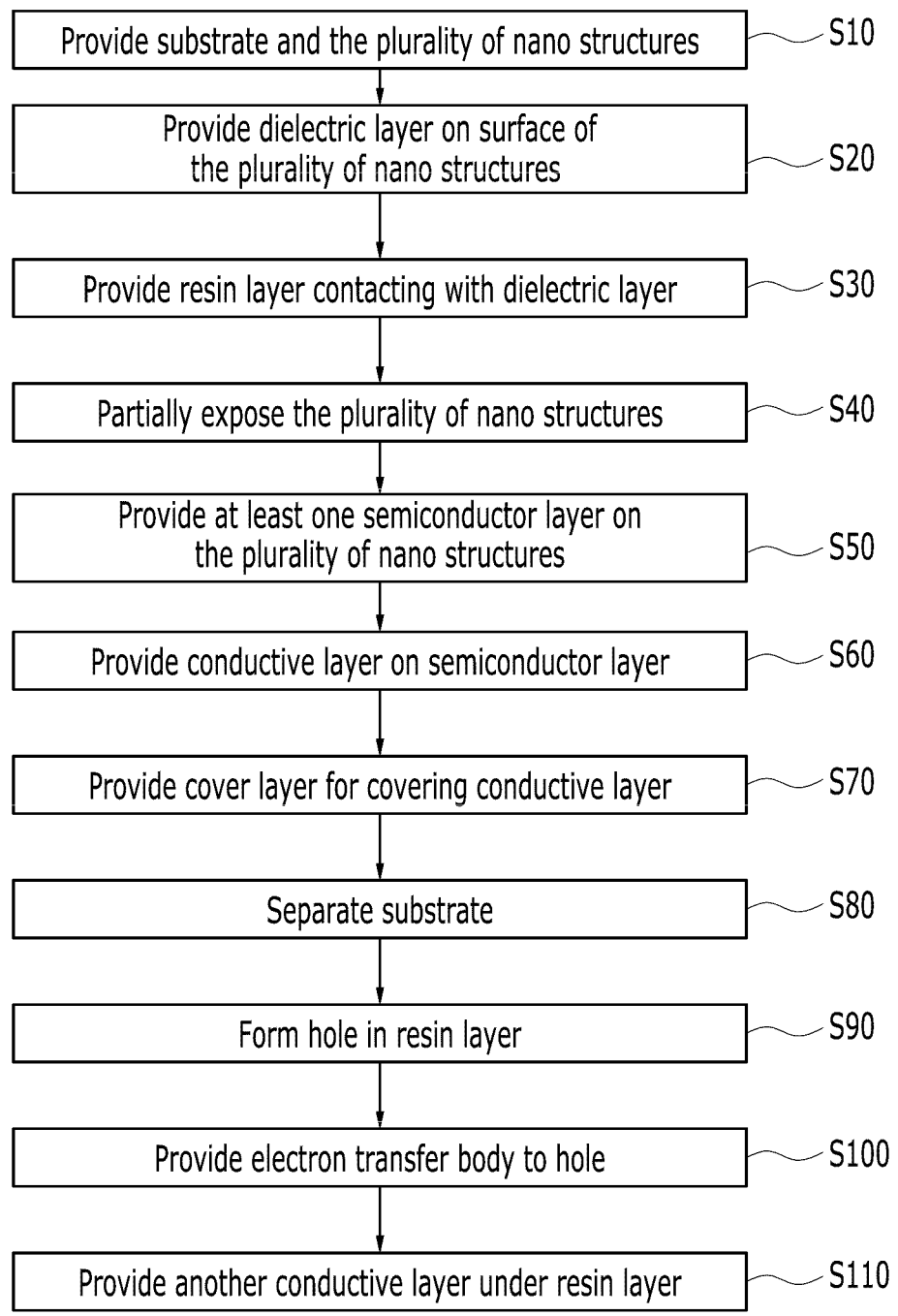
FIG. 2 is a schematic flowchart illustrating a method of manufacturing the solar cell of FIG. 1.
Figure 3:
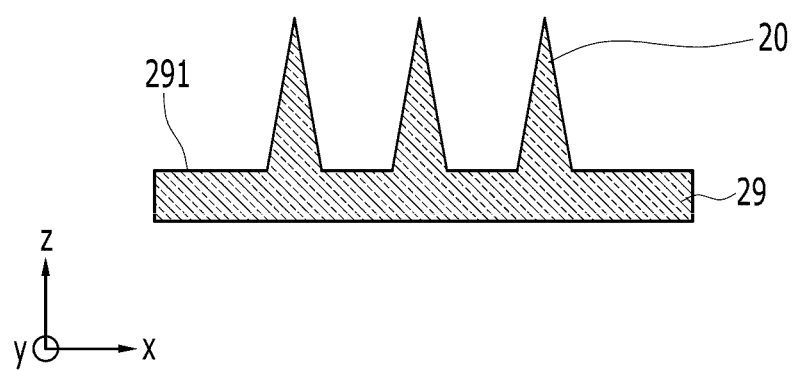
FIGS. 3 to 12 are cross-sectional views sequentially illustrating a method of manufacturing the solar cell of FIG. 1.

FIG. 2 schematically shows a flowchart illustrating a process of manufacturing the solar cell 100 of FIG. 1, and FIGS. 3 to 12 illustrate each step of a process of manufacturing the solar cell 100 of FIG. 2. Hereinafter, a process of manufacturing the solar cell 100 will be sequentially described in detail with reference to FIGS. 2 and 3 to 12.

First, the substrate 29 and the plurality of nano structures 20 (shown in FIG. 3) are provided (S10). The substrate 29 and the plurality of nano structures 20 are formed by doping silicon into an n+ type. A production cost of the solar cell 100 (shown in FIG. 1) can be reduced using the substrate 29 and a plurality of nano structures 20 that are made of a relatively cheap material. Here, the substrate 29 and the plurality of nano structures 20 may be integrally provided by electroless etching bulk silicon using a particle such as Ag. Further, in order to manufacture the plurality of nano structures 20 in a cone shape, the plurality of nano structures 20 may be additionally etched using a solution such as KOH.

Figure 4:
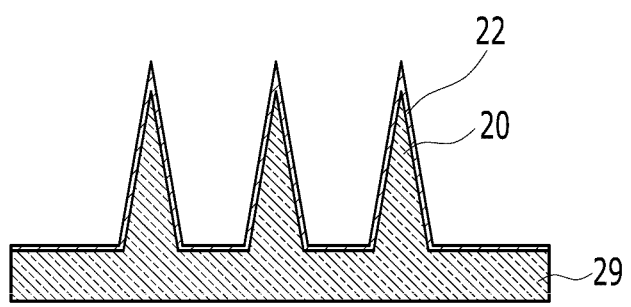

Next, the dielectric layer 22 is provided on a surface of the plurality of nano structures 20 (S20) (shown in FIG. 4). The dielectric layer 22 may be deposited on a surface of the substrate 29 and the plurality of nano structures 20.

Figure 5:
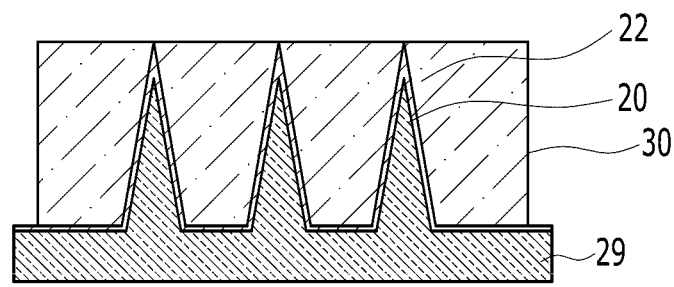

The resin layer 30 contacting with the dielectric layer 22 is provided (S30) (shown in FIG. 5). The resin layer 30 is formed on the substrate 29. The resin layer 30 is filled at space between the plurality of nano structures 20 and contacts with the dielectric layer 22. For example, liquid resin is disposed at space between the plurality of nano structures 20 to be spin coated, and then is cured, thereby forming the resin layer 30.

Figure 6:
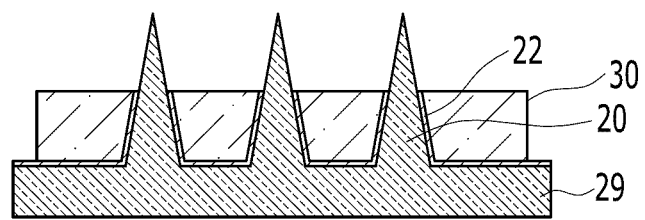
Figure 7:
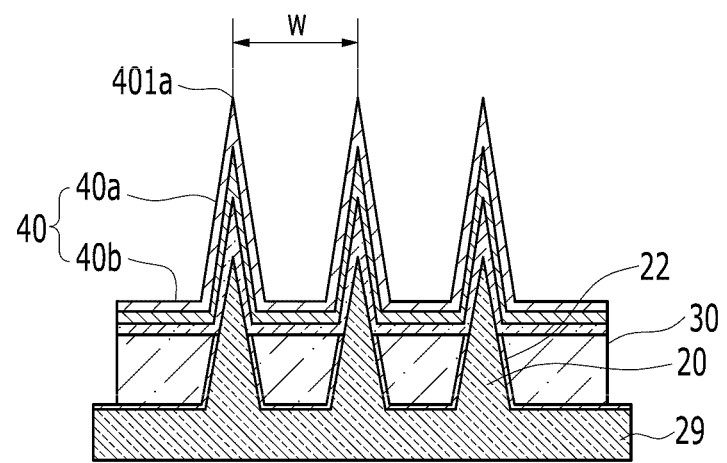

Next, by etching an upper portion of the resin layer 30 and the dielectric layer 22, the plurality of nano structures 20 are partially exposed (S40) (shown in FIG. 6). Here, the dielectric layer 22 is a portion contacting with an upper part of the resin layer 30. Therefore, an upper portion of the plurality of nano structures 20 is exposed to the outside on the resin layer 30.

The semiconductor layer 40 is formed on the plurality of nano structures 20 (S50). Here, the semiconductor layer 40 includes a plurality of first semiconductor portions 40a and a second semiconductor portion 40b. The plurality of first semiconductor portions 40a are positioned on the plurality of first nano structures 20. A width W between upper end portions 401a of the plurality of first semiconductor portions 40a may be 100 nm to 2 μm. If the width W between upper end portions 401a of the plurality of first semiconductor portions 40a is so small, the plurality of first nano structures 20 are so densely formed and thus it is difficult to form the resin layer 30 at space therebetween. In contrast, if the width W between upper end portions 401a of the plurality of first semiconductor portions 40a is too large, the plurality of first nano structures 20 are so sparsely formed and thus it is difficult to obtain a desired light electromotive force. If the width W between the upper end portions 401a of the plurality of first semiconductor portions 40a is small, it is advantageous to trap light. If the width W between the upper end portions 401a of the plurality of first semiconductor portions 40a is large, a contact area of the first semiconductor portions 40a and the nano structure 20 is enlarged and thus it is advantageous for carrier collection. The second semiconductor portion 40b is connected to and integrally formed with the plurality of first semiconductor portions 40a and is positioned on the first conductive layer 30.

Figure 8:
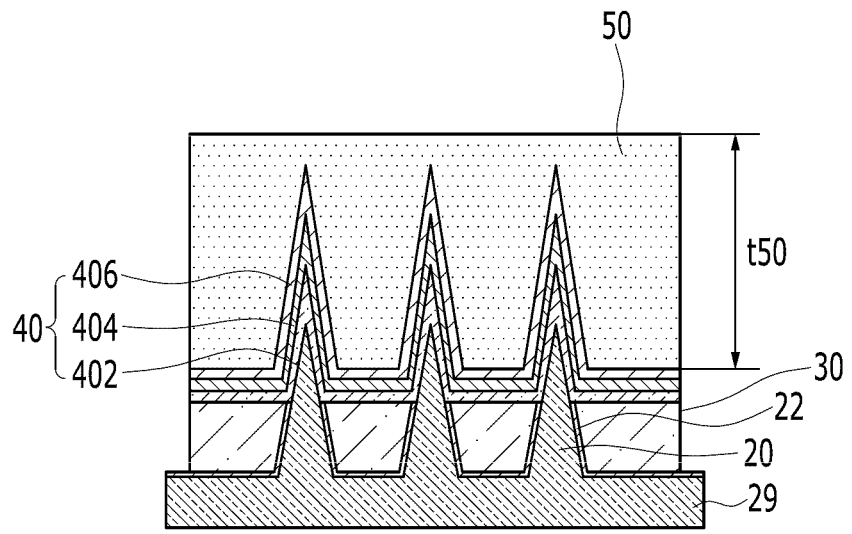

Next, the conductive layer 50 is provided on the semiconductor layer 40 (S60) (shown in FIG. 8). The semiconductor layer 40 includes a first semiconductor layer 402, a second semiconductor layer 404, and a third semiconductor layer 406 that are sequentially stacked through multi-step deposition and doping. As shown in FIG. 8, a thickness t50 of the conductive layer 50 may be 20 μm to 100 μm. The thickness t50 of the conductive layer 50 may be changed according to a length of the nano structure 20. If the thickness t50 of the conductive layer 50 is so large, a thickness of the solar cell 100 may increase. In contrast, if the thickness t50 of the conductive layer 50 is so small, the semiconductor layer 40 may be exposed to the outside, and thus light reflection by the conductive layer 50 is difficult. As a result, generation of an electromotive force of the solar cell 100 is deteriorated. In order not to transmit light of a long wavelength or for handling, it is necessary that the conductive layer 50 has somewhat a thickness. The conductive layer 50 is formed by performing electroless plating on the conductive layer 50.

Figure 9:
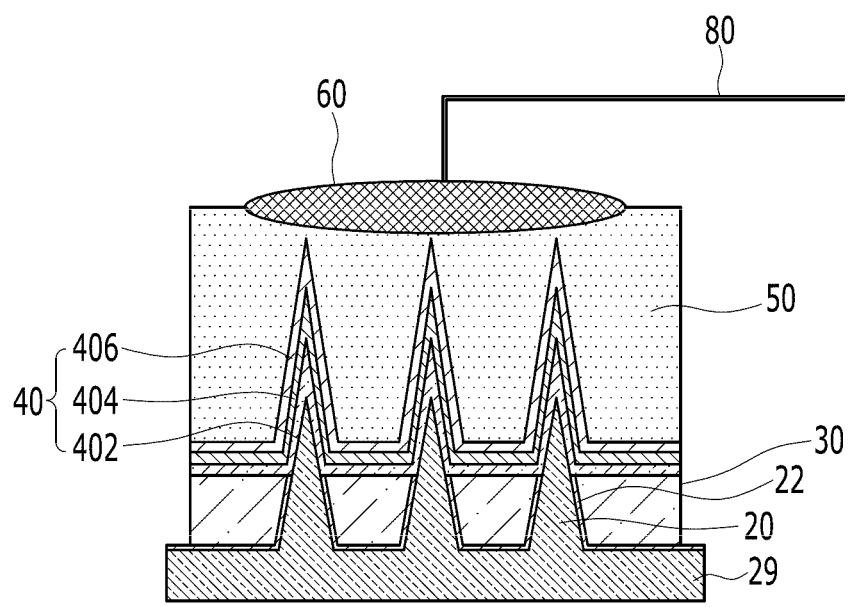

As shown in FIG. 9, the contact electrode 60 is formed on the conductive layer 50. For example, after the contact electrode 60 is deposited on the conductive layer 50, the drawn-out wiring 80 is connected to the contact electrode 60. Therefore, power that is transmitted through the conductive layer 50 may be supplied to the outside through the contact electrode 60 and the drawn-out wiring 80.

Figure 10:
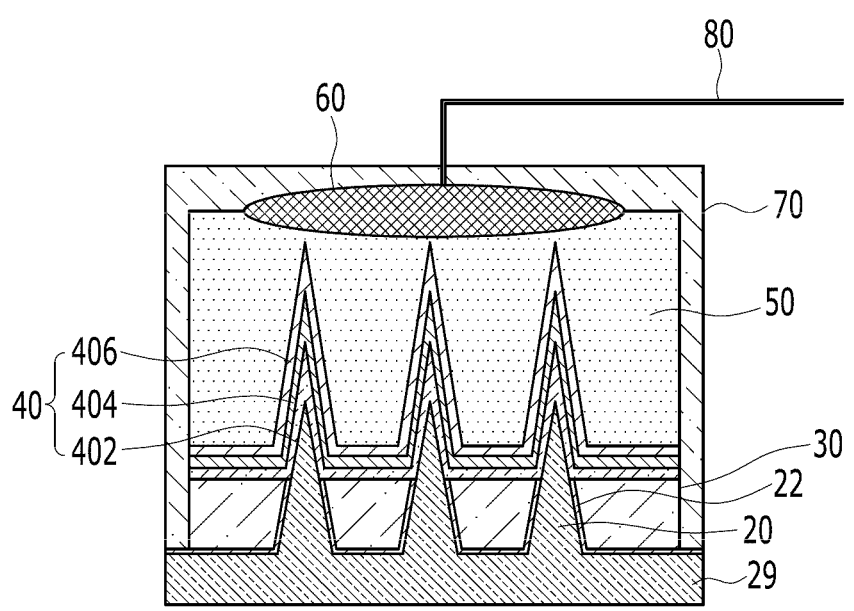

The cover layer 70 for covering the conductive layer 50 is provided (S70) (shown in FIG. 10). The cover layer 70 is formed by covering the resin layer 30, the conductive layer 50, and the contact electrode 60 on the substrate 29. Therefore, an external appearance of the solar cell 100 (shown in FIG. 1) is formed using the cover layer 70. The cover layer 70 is formed by spin coating and curing a resin.

Figure 11:
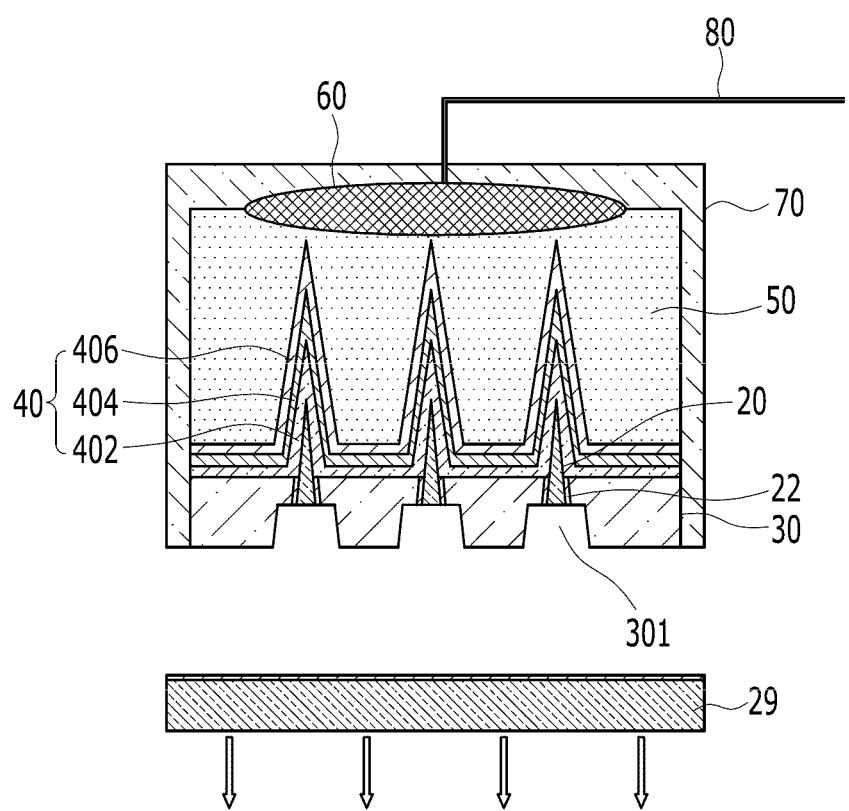

Next, the substrate 29 is separated from the resin layer 30 in an arrow direction (S80) (shown in FIG. 11). The separated substrate 29 forms another solar cell by recycling.

A hole 301 is formed in the resin layer 30 (S90) (shown in FIG. 11). That is, by etching the resin layer 30 corresponding to a lower end portion of the nano structures 20 with potassium hydroxide KOH, the hole 301 is formed.

Figure 12:
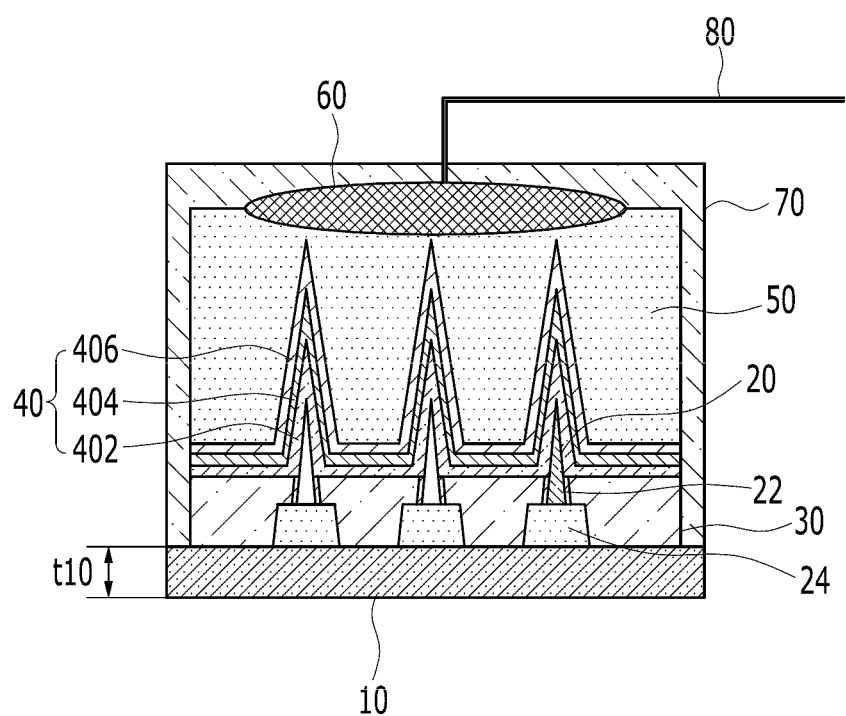

The electron transfer body 24 is provided to the hole 301 (S100) (shown in FIG. 12). The electron transfer body 24 may be provided by covering a mask in a lower part of the resin layer 30, exposing only the hole 301, and performing electroless plating.

Next, another conductive layer 10 is provided under the resin layer 30 (S110) (shown in FIG. 12). Here, a light transmittance of the other conductive layer 10 is lower than that of the conductive layer 50. A thickness t10 of the other conductive layer 10 may be 500 nm to 10 μm. If the thickness t10 of the conductive layer 10 is so large, a light transmittance of the conductive layer 10 may be deteriorated. Here, it is preferable that a light transmittance is maintained to 80% or more. Further, if the thickness t10 of the conductive layer 10 is so small, the conductive layer 10 has a very small thickness and thus an electrical connection state to the outside is not good. Furthermore, if the thickness t10 of the conductive layer 10 is so small, illuminance of the conductive layer 10 is smaller than that of a surface of the nano structure 20 and thus the conductive layer 10 cannot fully cover the nano structure 20. Therefore, the conductive layer 10 having a thickness t10 of the above-described range is formed.

Figure 13:
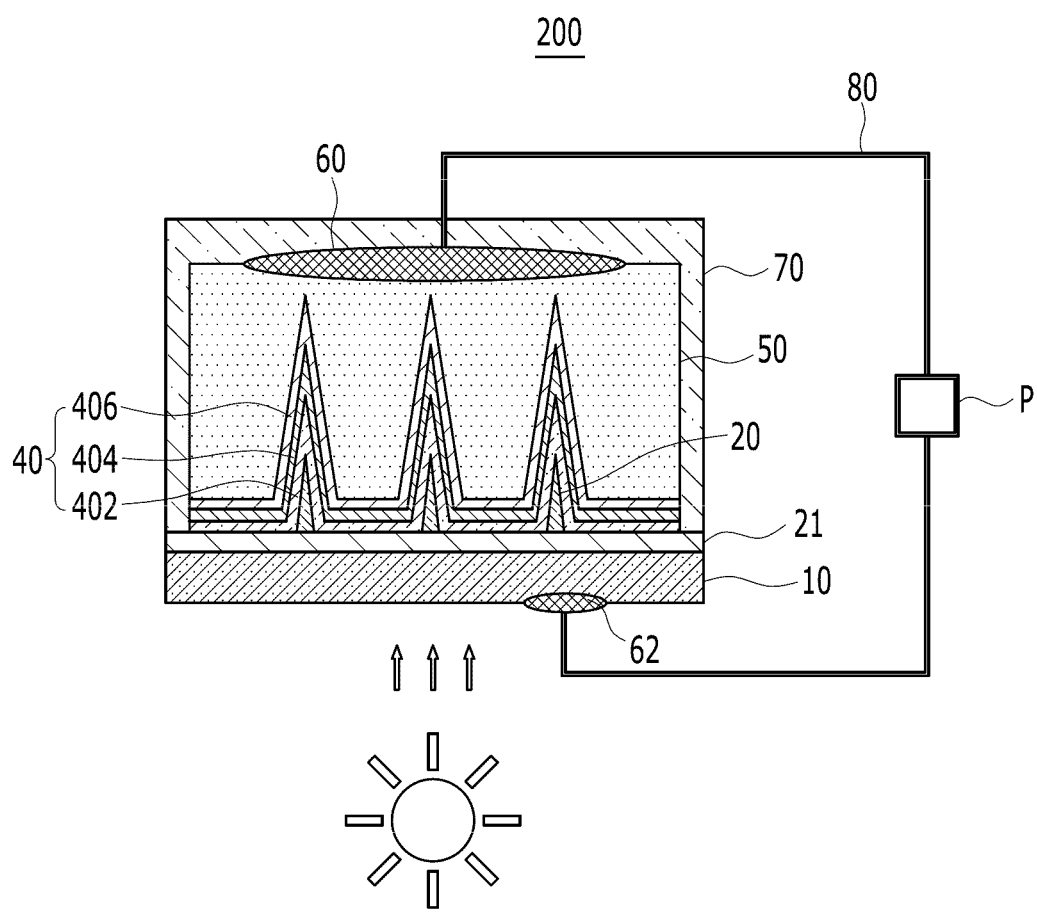
FIG. 13 is a schematic cross-sectional view illustrating a solar cell according to a second exemplary embodiment of the present invention.

FIG. 13 schematically shows a cross-sectional view of a solar cell 200 according to a second exemplary embodiment of the present invention. The structure of the solar cell 200 of FIG. 13 is similar to that of the solar cell 100 of FIG. 1, except for the dielectric layer 22 and the resin layer 30 of FIG. 1, and thus the same elements as those of FIG. 1 are denoted by the same reference numerals and a detailed description thereof will be omitted. Further, the structure of the solar cell 200 of FIG. 13 only illustrates the present invention and the present invention is not limited thereto. Therefore, the section structure of the solar cell 200 may be changed to other forms.

As shown in FIG. 13, an electron transfer body 21 covers a first conductive layer 10. Here, the electron transfer body 21 contacts with a first semiconductor layer 402. The electron transfer body 21 includes a p+ type semiconductor material or an n+ type semiconductor material. When the electron transfer body 21 is a p+ type semiconductor material, for example, p+ type doped silicon, nano structures 20, the first semiconductor layer 402, a second semiconductor layer 404, and a third semiconductor layer 406 may be made of a p-type semiconductor material, an intrinsic material, an n-type semiconductor material, and an n+ type semiconductor material, respectively. Therefore, by conformally forming the plurality of nano structures 20 and the semiconductor layer 40, an energy band gap can be lowered. In FIG. 13, three semiconductor layers 402, 404, and 406 are included, but one, two, or four or more semiconductor layers may be formed.

Figure 14:
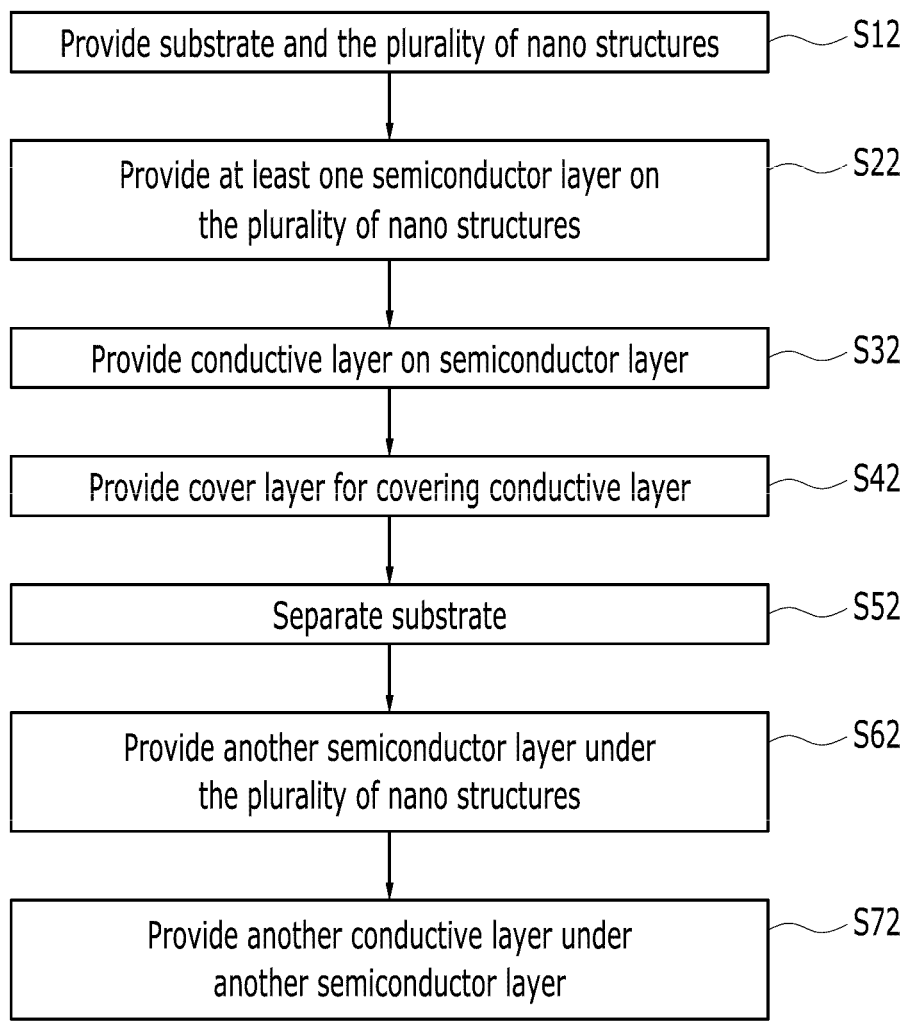
FIG. 14 is a schematic flowchart illustrating a method of manufacturing the solar cell of FIG. 13.
Figure 15:
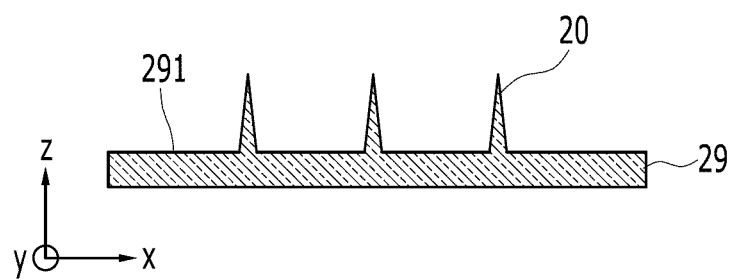
FIGS. 15 to 20 are cross-sectional views sequentially illustrating a method of manufacturing the solar cell of FIG. 13.
Figure 16:
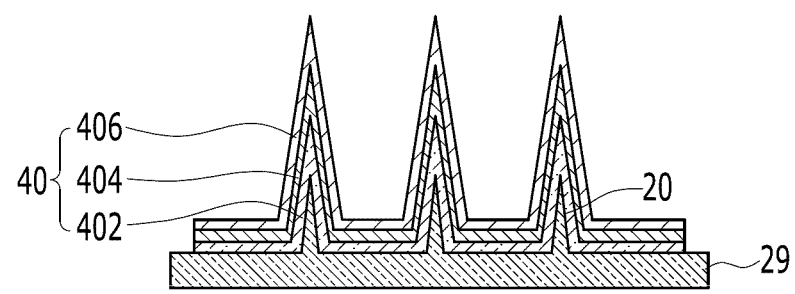

FIG. 14 schematically shows a flowchart illustrating a manufacturing process of the solar cell 200 of FIG. 13, and FIGS. 15 to 20 illustrate each step of a manufacturing process of the solar cell 200 of FIG. 14. Hereinafter, a manufacturing process of the solar cell 200 will be sequentially described with reference to FIGS. 14 and 15 to 20.

First, a substrate 29 and a plurality of nano structures 20 (shown in FIG. 15) are provided (S12). The substrate 29 and the plurality of nano structures 20 are produced by doping silicon into an n+ type. The substrate 29 and the plurality of nano structures 20 are produced by electroless etching bulk silicon using a particle such as Ag. Further, in order to form the plurality of nano structures 20 in a cone shape, the plurality of nano structures 20 may be additionally etched by KOH.

At least one semiconductor layer 40 is provided on the plurality of nano structures 20 (S22). That is, as shown in FIG.

16, three semiconductor layers 402, 404, and 406 may be formed. The semiconductor layer 40 may be formed by ion doping.

Figure 17:
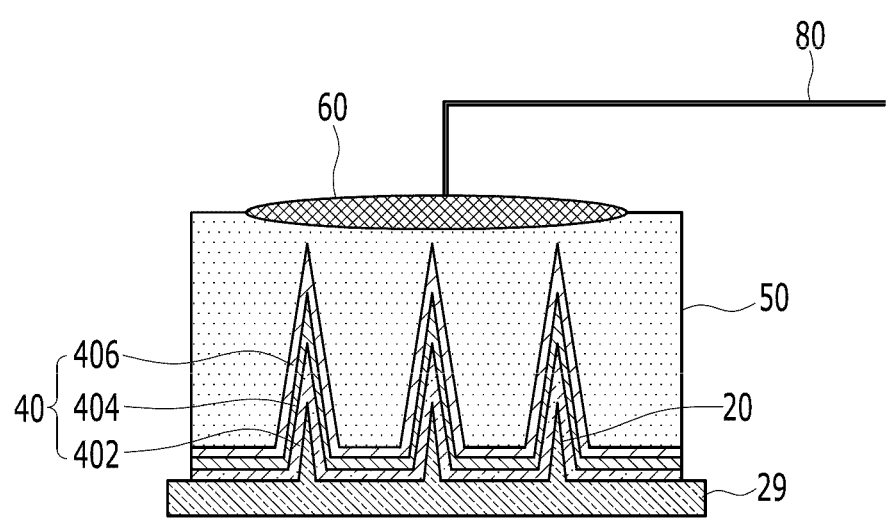

Next, the conductive layer 50 is provided on the semiconductor layer 40 (S32) (shown in FIG. 17). Further, a contact electrode 60 for electrically connecting the conductive layer 50 to the outside is provided on the conductive layer 50. For example, after the contact electrode 60 is deposited on the conductive layer 50, a drawn-out wiring 80 is connected to the contact electrode 60. Therefore, power that is transmitted through the conductive layer 50 is supplied to the outside through the contact electrode 60 and the drawn-out wiring 80.

Figure 18:
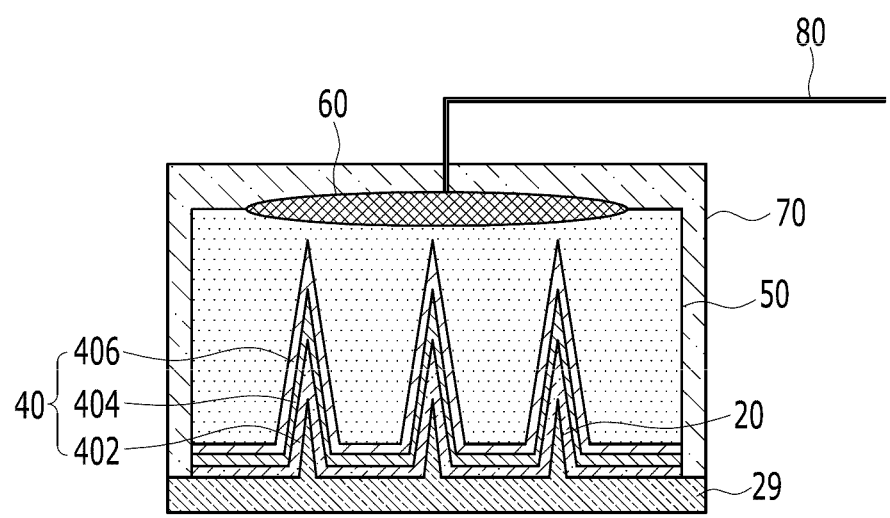

A cover layer 70 for covering the conductive layer 50 is provided (S42) (shown in FIG. 18). The cover layer 70 is formed by covering the conductive layer 50 and the contact electrode 60 on the substrate 29. Therefore, an external appearance of the solar cell 200 is formed using the cover layer 70 (shown in FIG. 13).

Figure 19:
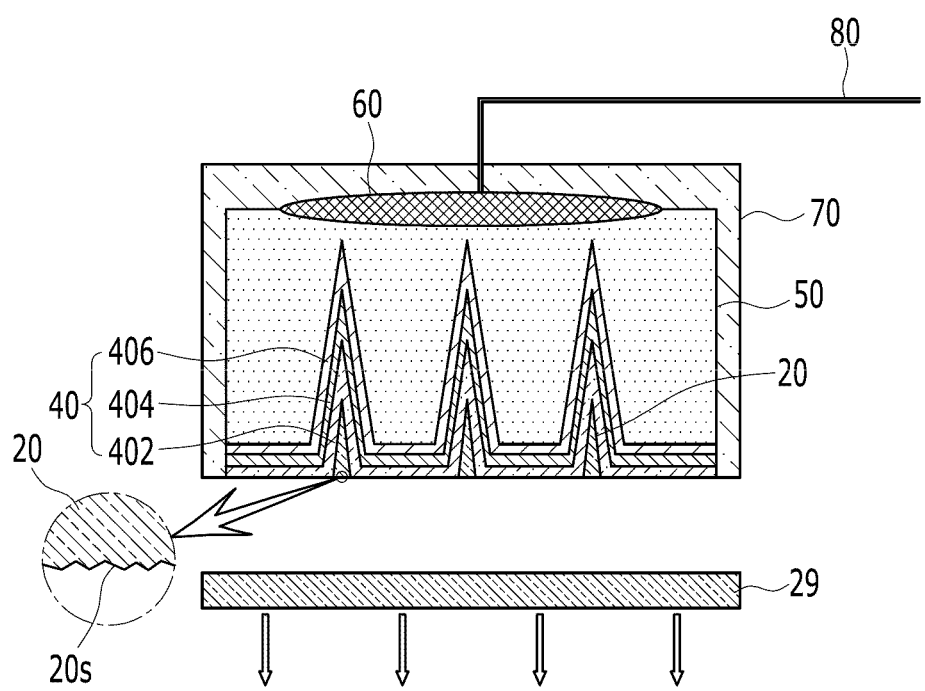

Next, the substrate 29 is separated from the semiconductor layer 40 in an arrow direction (S52) (shown in FIG. 19). By recycling the separated substrate 29, another solar cell can be produced.

As shown in an enlarged circle of FIG. 19, a lower surface 20s of the nano structure 20 in which the substrate 29 is removed is unevenly formed. Therefore, light that is applied through the lower surface 20s is not reflected by the lower surface 20s and is well applied to the nano structure 20. Therefore, optical absorption efficiency of the nano structure 20 can be maximized. The lower surface 20s of the nano structure 20 may be irregularly formed by grinding, as needed.

Figure 20:
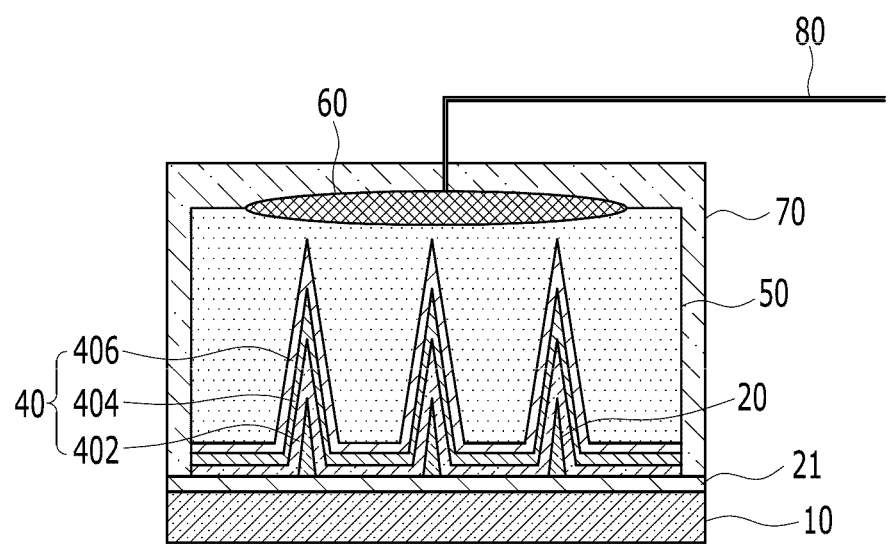

Another semiconductor layer 21 is provided under the plurality of nano structures 20 (S62) (see FIG. 20). Here, the other semiconductor layer 21 is made of an n+ type semiconductor material or a p+ type semiconductor material. Another semiconductor layer 21 is formed by ion doping. The lower surface 20s (shown in FIG. 19) of the nano structure 20 contacts with another semiconductor layer 21. Because another semiconductor layer 21 is made of the foregoing semiconductor material, light reflection may be large. However, because the lower surface 20s of the nano structure 20 is unevenly formed, light reflection can be prevented to the maximum.

Next, another conductive layer 10 is provided under another semiconductor layer 21 (S72) (shown in FIG. 20). Here, in a visible ray area, a light transmittance of the other conductive layer 10 is lower than that of the conductive layer 50.

Figure 21:
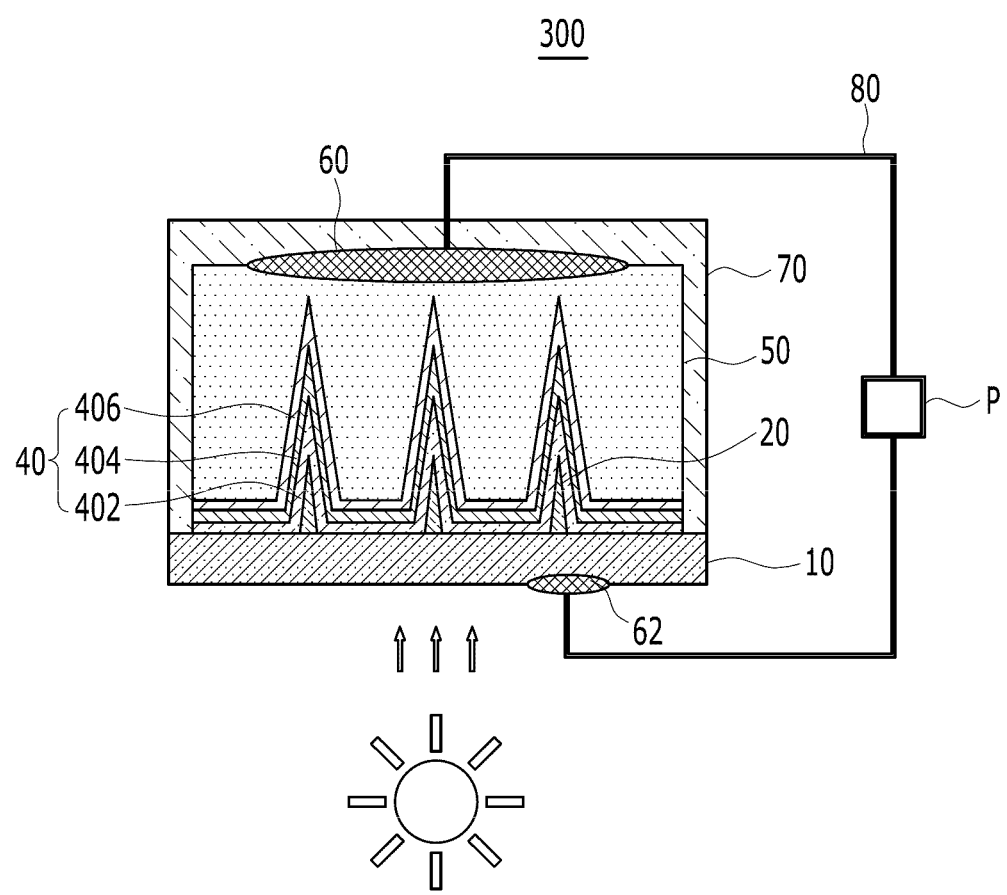
FIG. 21 is a schematic cross-sectional view illustrating a solar cell according to a third exemplary embodiment of the present invention.

FIG. 21 schematically shows a section structure of a solar cell 300 according to a third exemplary embodiment of the present invention. The structure of the solar cell 300 of FIG. 21 is similar to that of the solar cell 200 of FIG. 13, and thus the same elements as those of FIG. 13 are denoted by the same reference numerals and a detailed description thereof will be omitted. Further, a structure of the solar cell 300 of FIG. 21 only illustrates the present invention, and the present invention is not limited thereto. Therefore, a section structure of the solar cell 300 may be changed to other forms.

As shown in FIG. 21, the first conductive layer 10 directly contacts with a plurality of semiconductor layers 40 and the plurality of nano structures 20. Here, the plurality of nano structures 20, a first semiconductor layer 402, a second semiconductor layer 404, and a third semiconductor layer 406 are made of a p+ type semiconductor material, a p-type semiconductor material, an intrinsic material, and an n-type semiconductor material, respectively. Alternatively, the plurality of nano structures 20, the first semiconductor layer 402, the second semiconductor layer 404, and the third semiconductor layer 406 may be made of an n+ type semiconductor material, an n-type semiconductor material, an intrinsic material, and a p-type semiconductor material, respectively. Therefore, by lowering an energy band gap through the conformally formed first conductive layer 10, plurality of semiconductor layers 40, and plurality of nano structures 20, photoelectric conversion efficiency of the solar cell 300 can be maximized.

Figure 22:
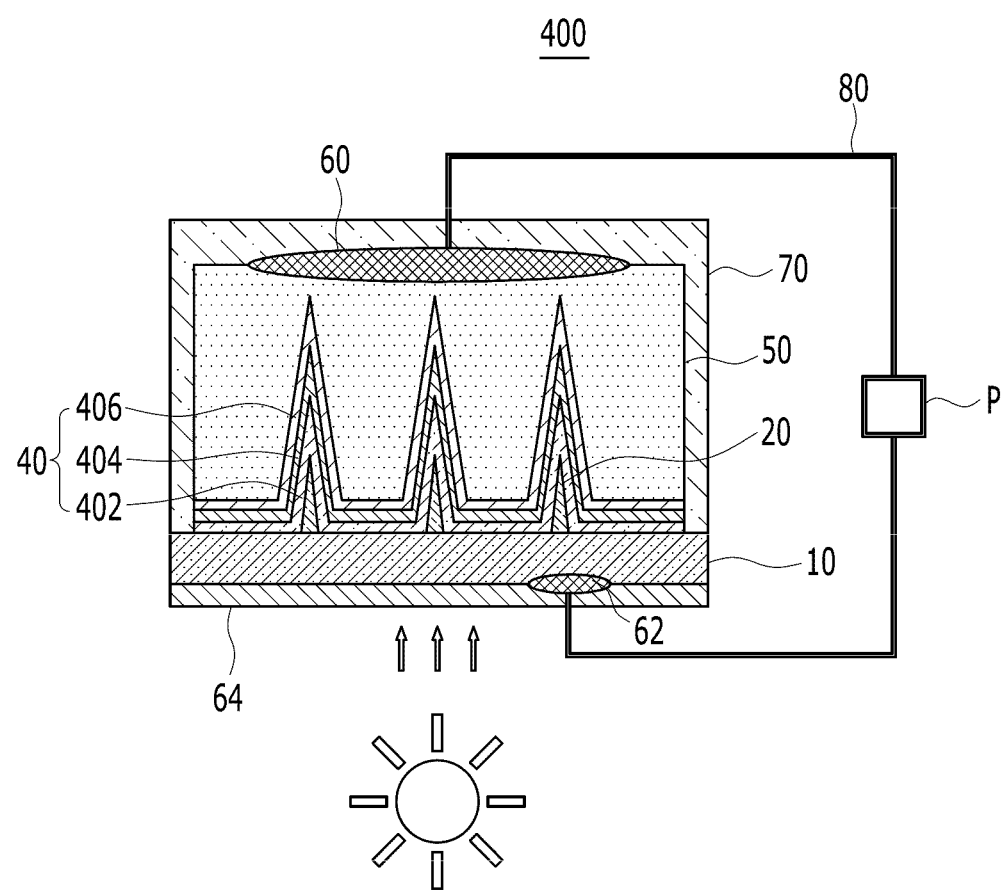
FIG. 22 is a schematic cross-sectional view illustrating a solar cell according to a fourth exemplary embodiment of the present invention.

FIG. 22 schematically shows a cross-sectional view of a solar cell 400 according to a fourth exemplary embodiment of the present invention. The structure of the solar cell 400 of FIG. 22 is similar to that of the solar cell 300 of FIG. 21, and thus the same elements as those of FIG. 21 are denoted by the same reference numerals and a detailed description thereof will be omitted. Further, the structure of the solar cell 400 of FIG. 22 only illustrates the present invention and the present invention is not limited thereto. Therefore, the cross-sectional view of the solar cell 400 may be changed to other forms.

As shown in FIG. 22, an anti-reflection (AR) layer 64 is provided under another conductive layer 10. By enabling light to be not reflected, the AR layer 64 absorbs light that is applied to the solar cell 400 to the maximum. As a result, light absorption efficiency of the solar cell 400 can be maximized.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 100, 200, 300. solar cell | 10, 50. conductive layer |
| 101, 291. plate surface | 20. nano structure |
| 20s. lower surface | 22. dielectric layer |
| 24. electron transfer body | 29. substrate |
| 30. resin layer | 301. hole |
| 21, 40, 402, 404, 406. semiconductor layer | |
| 40a, 40b. semiconductor portion | |
| 401a. upper end portion | 60, 62. contact electrode |
| 64. anti-reflection layer | 70. cover layer |
| 80. drawn-out wiring | P. passive element |

What is claimed is:

1. A solar cell, comprising:
   a first conductive layer;
   a plurality of nano structures that are positioned on the first conductive layer and that are extended to cross a surface of the first conductive layer and that are separated from each other;
   a resin layer that is positioned on the first conductive layer and that is filled at-in-a space between the plurality of nano structures;
   at least one semiconductor layer that is positioned on the resin layer and that covers the plurality of nano structures;
   a second conductive layer that covers the semiconductor layer and that has a light transmittance lower than that of the first conductive layer; and
   at least one electron transfer body that is positioned on the first conductive layer and that contacts with a lower end portion of the plurality of nano structures, wherein the electron transfer body covers the first conductive layer, and the electron transfer body comprises a p+ type semiconductor material or an n+ type semiconductor material.

2. The solar cell of claim 1 further comprising a dielectric layer that is positioned on a surface of the plurality of nano structures and that contacts with the resin layer.

3. The solar cell of claim 1, wherein the second conductive layer has a thickness of 20 μm to 100 μm.

4. The solar cell of claim 1, wherein the second conductive layer and the electron transfer body comprise the same metal.

5. The solar cell of claim 4, wherein the metal is at least one element that is selected from a group consisting of aluminum (Al), silver (Ag), nickel (Ni), gold (Au), and platinum (Pt).

6. The solar cell of claim 1, wherein the at least one semiconductor layer comprises a plurality of semiconductor layers, and a semiconductor layer contacting with the electron transfer body of the plurality of semiconductor layers comprises an intrinsic material.

7. The solar cell of claim 1, wherein the at least one semiconductor layer comprises a plurality of semiconductor layers, and at least one semiconductor layer of the plurality of semiconductor layers comprises a plurality of first semiconductor portions that are positioned on the plurality of first nano structures; and
a second semiconductor portion that is connected to the first semiconductor portion to be integrally formed with the first semiconductor portion and that is positioned on the resin layer,
wherein a width between upper end portions of the plurality of first semiconductor portions is 100 nm to 2 μm.

8. The solar cell of claim 1 further comprising a cover layer that covers the second conductive layer and that contacts with a side surface of the resin layer.

9. The solar cell of claim 8 further comprising a contact electrode that is positioned within the cover layer and that electrically connects the second conductive layer to the outside by contacting with the second conductive layer.

10. The solar cell of claim 1, wherein the plurality of nano structures comprise a semiconductor material.

11. The solar cell of claim 1, wherein the first conductive layer has a thickness of 30 nm to 300 nm.

12. The solar cell of claim 1, wherein the dielectric layer comprises at least one material that is selected from a group consisting of aluminum oxide ($Al_2O_3$), silicon nitride ($SiN_x$), silicon carbide (SiC), and silicon dioxide ($SiO_x$).

* * * * *